United States Patent
Kodama et al.

(10) Patent No.: US 9,224,937 B2
(45) Date of Patent: Dec. 29, 2015

(54) PRECURSOR OF MGB2 SUPERCONDUCTING WIRE, AND METHOD FOR PRODUCING THE SAME

(71) Applicants: The University of Tokyo, Bunkyo-ku, Tokyo (JP); Hitachi, Ltd., Chiyoda-ku, Tokyo (JP)

(72) Inventors: Motomune Kodama, Tsuchiura (JP); Kazuhide Tanaka, Hitachi (JP); Junichi Shimoyama, Tokyo (JP); Akiyasu Yamamoto, Tokyo (JP)

(73) Assignees: Hitachi, Ltd., Tokyo (JP); The University of Tokyo, Tokyo (JP)

( * ) Notice: Subject to any disclaimer, the term of this patent is extended or adjusted under 35 U.S.C. 154(b) by 0 days.

(21) Appl. No.: 13/748,027

(22) Filed: Jan. 23, 2013

(65) Prior Publication Data

US 2014/0024533 A1  Jan. 23, 2014

(30) Foreign Application Priority Data

Jan. 24, 2012  (JP) ................................. 2012-011689

(51) Int. Cl.
| | | |
|---|---|---|
| *G01R 33/035* | (2006.01) | |
| *H01L 39/12* | (2006.01) | |
| *H01L 39/14* | (2006.01) | |
| *H01L 39/24* | (2006.01) | |
| *C01B 35/04* | (2006.01) | |

(52) U.S. Cl.
CPC ............ *H01L 39/125* (2013.01); *C01B 35/04* (2013.01); *H01L 39/141* (2013.01); *H01L 39/2487* (2013.01); *Y10T 428/12181* (2015.01)

(58) Field of Classification Search
CPC .. H01L 39/125; H01L 39/141; H01L 39/2487
USPC ................................. 505/162, 230, 430, 510
IPC .......................... H01L 39/125, 39/141, 39/2487
See application file for complete search history.

(56) References Cited

U.S. PATENT DOCUMENTS

2002/0173428 A1*  11/2002  Thieme et al. ................ 505/100
2002/0198109 A1*  12/2002  Wu ................................ 505/100

(Continued)

FOREIGN PATENT DOCUMENTS

JP  2004-319107 A   11/2004
JP  2006-216443 A    8/2006

(Continued)

OTHER PUBLICATIONS

Kim et al. "Tailored Materials for High-Performance MgB2 Wire". Adv. Mater. 2011, 23, 4942-4946.*

(Continued)

*Primary Examiner* — Paul Wartalowicz
(74) *Attorney, Agent, or Firm* — Crowell & Moring LLP

(57) ABSTRACT

An $MgB_2$ superconducting wire excellent in critical current density property is supplied by using a crystalline boron powder which is low in costs and easy to obtain. For the wire, a precursor of the $MgB_2$ superconducting wire is used, the precursor having a linear structure including a core region containing a magnesium powder and a boron powder, and a sheath region formed of a metal covering an outer circumferential portion of the core region. The boron powder is crystalline, and has a volume-mean particle size of 2 μm or less.

11 Claims, 5 Drawing Sheets

(56) References Cited

U.S. PATENT DOCUMENTS

| | | |
|---|---|---|
| 2004/0204322 A1 | 10/2004 | Tanaka et al. |
| 2007/0157450 A1* | 7/2007 | Takahashi et al. ............. 29/458 |
| 2009/0005251 A1 | 1/2009 | Fluekiger et al. |
| 2009/0170710 A1 | 7/2009 | Tanaka et al. |
| 2010/0323899 A1* | 12/2010 | Giunchi ..................... 505/166 |
| 2012/0004110 A1 | 1/2012 | Takahashi et al. |
| 2012/0083415 A1 | 4/2012 | Tanaka et al. |
| 2012/0220465 A1 | 8/2012 | Tanaka et al. |
| 2013/0012395 A1 | 1/2013 | Tanaka et al. |
| 2013/0101488 A1* | 4/2013 | Lustig ........................ 423/298 |

FOREIGN PATENT DOCUMENTS

| | | |
|---|---|---|
| JP | 2007-157590 A | 6/2007 |
| JP | 2012-14912 A | 1/2012 |
| JP | 2012-74330 A | 4/2012 |
| JP | 2012-178226 A | 9/2012 |
| JP | 2013-16396 A | 1/2013 |
| WO | WO 2008/122802 A1 | 10/2008 |

OTHER PUBLICATIONS

Giunchi et al., "Grain Size Effects on the Superconducting Properties of High Density Bulk MgB2", Supercond. Sci. Technol., 2004, vol. 17, pp. S583-S588 (six (6) sheets).

Katsura et al., "Grain Size Determinants and Grain-Boundary Pinning in In-situ MgB2 Bulks", Cryogenic Engineering, 2006, vol. 41, pp. 497-504 (eight (8) sheets).

European Search Report dated Nov. 28, 2014 (nine pages).

Xu et al. "Superconducting Properties of $MgB_2$ Wire Using Ball-Milled Low Purity Boron" IEEE Transactions on Applied Superconductivity, Jun. 1, 2009, pp. 2714-2717, vol. 19, No. 3, XP011263724.

Haessler et al. "$MgB_2$ bulk and tapes prepared by mechanical alloying: influence of the boron precursor powder" Superconductor Science and Technology, 2006, pp. 512-520, Jun. 1, 2006, vol. 19, No. 6, Institute of Physics Publishing, XP020100971.

\* cited by examiner

PRECURSOR OF MGB2 SUPERCONDUCTING WIRE, AND METHOD FOR PRODUCING THE SAME

CLAIM OF PRIORITY

The present application claims priority from Japanese Patent application serial No. 2012-011689, filed on Jan. 24, 2012, the content of which is hereby incorporated by reference into this application.

BACKGROUND OF THE INVENTION

1. Field of the Invention

The present invention relates to a precursor of a superconducting wire having a core of $MgB_2$.

2. Description of Related Art $MgB_2$ is a superconductor discovered in the year 2001. Since $MgB_2$ has the highest critical temperature (of 39 K) among metallic superconductors, this superconductor may make it possible to operate superconducting machines at a temperature of 10 to 20 K, which is higher than conventional superconducting-machine-operating temperatures. Thus, the application thereof in this field has been expected. The expectation has been directed, in particular, to application to machines using a magnetic field very small in fluctuation with time, such as nuclear magnetic resonance spectrometers, and magnetic resonance imaging diagnostic machines for medicine. This is because $MgB_2$ hardly causes a problem of flux creep which arises remarkably in cuprate superconductors or others.

$MgB_2$ gives a practical critical current density in the case of filling a powder thereof into a metallic tube, subjecting the workpiece to area-reducing working to be made into a wire, and then firing the wire. This wire-producing method is called the powder-in-tube method. The powder-in-tube method, which may be referred to as the "PIT method" hereinafter, is roughly classified into two methods in accordance with the species of the powder to be filled.

One of the two is a method of using Mg (magnesium) powder and B (boron) powder as the powder to be filled, and firing the powders to produce $MgB_2$. This is called the in-situ method. The other is a method of using $MgB_2$ powder (magnesium diboride powder) as the powder to be filled, and firing the powder to strengthen bonding between particles of the $MgB_2$ powder. This is called the ex-situ method.

Japanese Patent Laid-open No. 2007-157590 (Patent Document 1) discloses a method for producing a magnesium diboride superconducting wire by the powder-in-tube method, the method including the steps of arranging a metallic core into a powder inside a metallic tube, and then subjecting the workpiece to area-reducing working provided that a thin-film layer of components to be introduced into a superconductor to be obtained is laid onto the metallic core or metallic tube in advance before the working, whereby strong power in the area-reducing working step is used to disperse the components into the superconductor.

G. Ginuchi et al. "Grain size effects on superconducting properties of high density bulk $MgB_2$" Supercond. Sci. Technol. 17 (9) (2004) 5583-588 (Non-Patent Document 1) states that it is desired that B powder as the raw material is a fine amorphous powder.

Katsura et al. "Particle Size Reinforcing Factors and Grain Boundary Pinning of In-situ Method $MgB_2$ Bulk" Cryogenic Engineering, Vol. 41 (2006) No. 11 pp. 497-504 (Non-Patent Document 2) describes a matter that particle-size-reinforcing factors of a non-doped in-situ $MgB_2$ bulk are the particle size of raw-material boron (B), the thermal treatment temperature, the ratio between components of the starting material, and others; a matter that the production of $MgB_2$ high in grain boundary density is effective for improving the critical current density Jc property of the $MgB_2$ bulk in a high magnetic field; and others.

SUMMARY OF THE INVENTION

The present invention can provide a precursor of an $MgB_2$ superconducting wire, having a linear structure including a core region containing a magnesium powder and a boron powder, and a sheath region formed of a metal covering an outer circumferential portion of the core region, in which the boron powder is crystalline, and has a volume-mean particle size of 2 μm or less.

According to the present invention, a crystalline boron powder easily available and low in cost is used to make it possible to provide the $MgB_2$ superconducting wire excellent in critical current density property. Additionally, it becomes easy to make the $MgB_2$ superconducting wire into a thin-wire form, a long-wire form, and a form having a multi-core structure.

DETAILED DESCRIPTION OF THE PREFERRED EMBODIMENTS

Figure 1:
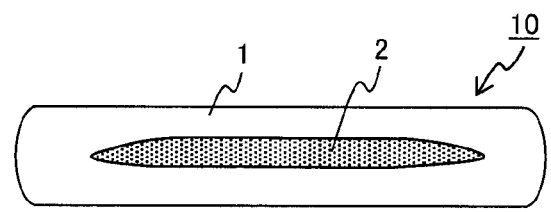
FIG. 1 is a schematic sectional view illustrating a tape wire.

The present invention relates to a precursor of a superconducting wire having a core of $MgB_2$ (magnesium diboride), and to a superconducting wire obtained by firing this precursor and having a high critical current density property and a high mechanical strength. A superconductor magnet obtained by making this precursor into a coil form and then firing the coil can be applied to any nuclear magnetic resonance spectrometer or magnetic resonance imaging diagnostic machine for medicine.

The in-situ method is characterized in that $MgB_2$ produced is higher in electrical intergrain connectivity than that produced by the ex-situ method. This characteristic can give a high critical current density property. In the in-situ method, characters of B powder produce a large effect onto the critical current density property of $MgB_2$.

Researches that have been made so far have demonstrated that it is effective to use amorphous B powder (amorphous boron powder) high in purity as a raw material. When crystalline B powder (crystalline boron powder) is used as a raw material, the critical current density property of the resultant is low. For this reason, in many researches about an improvement in the critical current density of $MgB_2$ superconducting wires, a high-purity amorphous B powder is used as a raw-material powder. However, the high-purity amorphous B powder is high in cost, and is not easily available. These matters are serious problems against the commercialization of $MgB_2$ superconducting wires.

An object of the present invention is to provide an $MgB_2$ superconducting wire excellent in critical current density property in the case of using a crystalline boron powder easily available and low in cost.

Hereinafter, a description will be made about a precursor of an $MgB_2$ superconducting wire according to an embodiment of the present invention, a method for producing the precursor, and others.

The precursor of $MgB_2$ superconducting wire (also referred to an $MgB_2$ superconducting wire precursor) is a precursor having a linear structure including a core region containing a magnesium powder and a boron powder, and a sheath region formed of a metal covering an outer circumferential portion of the core region, in which the boron powder is crystalline, and has a volume-mean particle size of 2 μm or less. The volume-mean particle size of the boron powder is desirably 0.8 μm or less, desirably in particular 0.5 μm or less.

In the $MgB_2$ superconducting wire precursor, the water content by percentage of each of the magnesium powder and the boron powder is desirably 0.5% or less by weight.

In the $MgB_2$ superconducting wire precursor, the ratio by mole of magnesium contained in the core region to boron contained therein is desirably from 1:1.5 to 1:2.5.

In the $MgB_2$ superconducting wire precursor, it is desired that the core region comprises a boron carbide powder ($B_4C$ powder), the boron carbide powder has a volume-mean particle size is 0.5 μm or less, and the ratio by mole of boron carbide contained in the core region to magnesium contained therein is from 0.01:1 to 0.2:1.

A method for producing the $MgB_2$ superconducting wire precursor is a method for producing the precursor that is a $MgB_2$ superconducting wire precursor having a linear structure including a core region containing a magnesium powder and a boron powder, and a sheath region formed of a metal covering an outer circumferential portion of the core region. This method includes the steps of: a pulverizing step of pulverizing a crystalline boron powder or a crystalline boron bulk to obtain a crystalline boron powder having a volume-mean particle size of 2 μm or less; a mixing step of mixing the crystalline boron powder with a magnesium powder to obtain a mixed powder; and a wire-forming step of filling the mixed powder into a metallic tube, and subjecting the resultant to area-reducing working to form a wire.

In the producing method thereof, the crystalline boron powder desirably has the volume-mean particle size of 0.5 μm or less. The wording "crystalline boron powder" denotes powdery crystalline boron, and the wording "crystalline boron bulk" denotes crystalline boron in a massive or block form.

The $MgB_2$ superconducting wire of the present invention is a wire produced by use of the $MgB_2$ superconducting wire precursor. In other words, the $MgB_2$ superconducting wire is a wire obtained by firing the $MgB_2$ superconducting wire precursor.

This $MgB_2$ superconducting wire can be applied to any nuclear magnetic resonance spectrometer or magnetic resonance imaging machine, or others.

Hereinafter, the above and matters related thereto will be described in more detail.

Properties of any $MgB_2$ test pieces are evaluated by forming the test pieces into tape wires by the in-situ PIT method, and then measuring the critical current density thereof.

Specifically, the formation of the tape wires is in accordance with the following steps:

EXAMPLES

First, an Mg powder and a B powder are prepared as raw materials of Mg and B, respectively. The powders are weighed to adjust the ratio by mole of the Mg powder to the B powder to 1:2, and then a mortar is used to mix these powders sufficiently with each other. The mixed powder is filled into an Fe tube (i.e., a tube made of Fe) having an outside diameter of 6.2 mm and an inside diameter of 3.5 mm. The tube is then sealed at ends thereof.

Thereafter, the tube is subjected to grooving roll forming into a rectangular wire having a size of 1.8 mm×1.8 mm (3.2 mm$^2$), and then subjected to rolling into a tape wire having a thickness of 0.5 mm and a width of 4.0 mm. The successive works from the weighting of the powders to the filling thereof are performed in the atmosphere of argon by use of a glove box.

FIG. 1 is a schematic sectional view illustrating the formed tape wire ($MgB_2$ superconducting wire).

In this figure, a tape wire 10 is composed of a sheath region 1 containing an Fe component, and a core region 2 made of a mixed powder of a Mg component and a B component.

In the core region 2 at the center of the wire, the mixture of the Mg powder and the B powder are present in the state of being compressed. $MgB_2$ which is a superconductor is generated in this region by firing the wire at an appropriate temperature.

The tape wire 10 made into a superconducting member by the firing is immersed in liquid helium (4.2 K), and a superconductive magnet is used to apply a magnetic field thereto. In this state, electric current is passed thereto. The voltage generated therein is measured by a four-terminal method. The current value giving a generated voltage of 1 μV per centimeter of the tape wire is defined as the critical current (of the wire). Furthermore, the value obtained by dividing the critical current by the area of the core region 2 of the tape wire 10 is defined as the critical current density Jc.

The volume-mean particle size (volume-average diameter) MV of particles described later is a volume-weighted mean of the particle sizes of specific individual values of the particles. Specifically, the volume-mean particle size MV is calculated out by the following expression (1) about the particles the number of which is n:

$$MV=(d_1V_1+d_2V_2+\ldots+d_nV_n)/(V_1+V_2+\ldots+V_n) \quad (1)$$

In this formula, the respective volumes of the particles are represented by Vi, and the respective diameters of the particles are represented by di, where i=1, 2, 3 . . . and n.

Figure 2A:
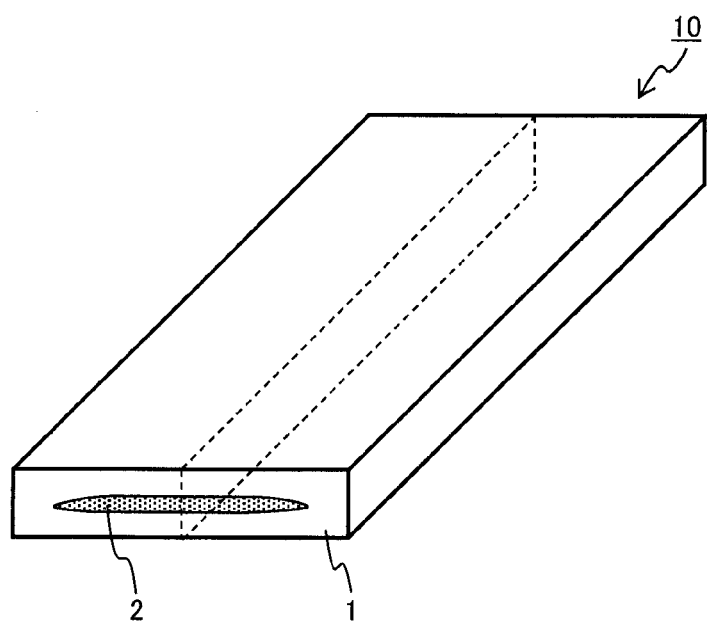
FIG. 2A is a perspective view illustrating the tape wire schematically.
Figure 2B:
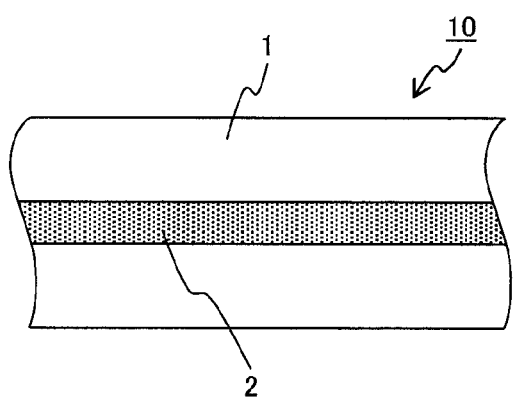
FIG. 2B is a partial sectional view of the wire in FIG. 2A.

FIG. 2A is a perspective view illustrating the tape wire schematically. FIG. 2B is a view illustrating a cross section of the wire that is obtained by cutting on a broken line drawn in FIG. 2A.

Figure 3A:
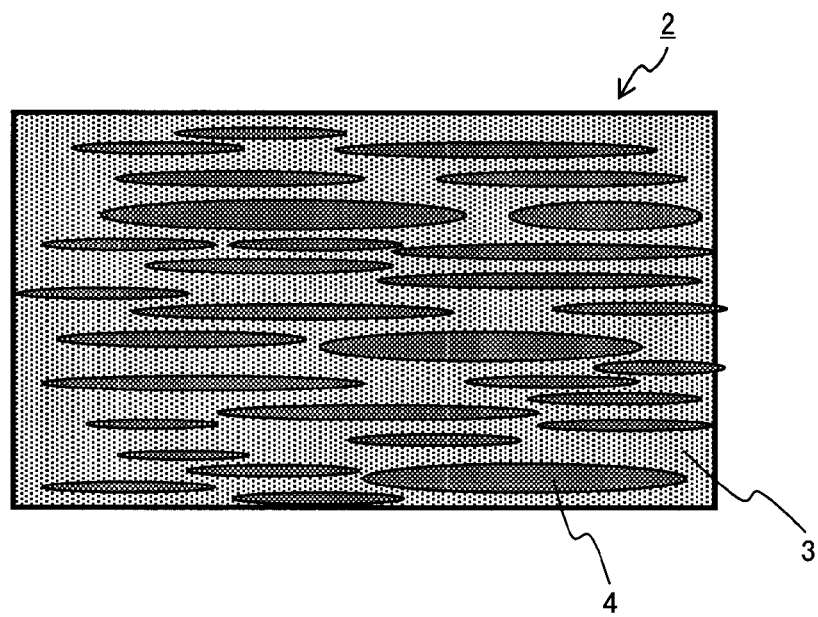
FIG. 3A is an enlarged sectional view which schematically illustrates an $MgB_2$ core region of the tape wire before the wire is fired.
Figure 3B:
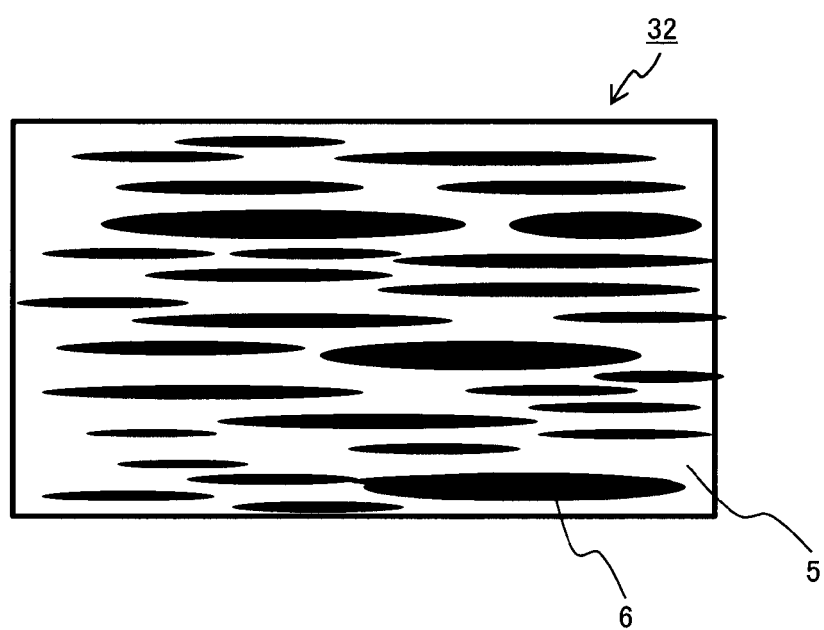
FIG. 3B is an enlarged sectional view which schematically illustrates the $MgB_2$ core region of the tape wire after the firing.

FIGS. 3A and 3B are each a view that schematically illustrates a state (microstructure) obtained by observing a cross section of the core region containing $MgB_2$ through a scanning electron microscope (SEM).

FIG. 3A shows the $MgB_2$ core region of the tape wire before the firing; and FIG. 3B, the $MgB_2$ core region of the rape wire after the firing.

As illustrated in FIG. 3A, particles 4 of the magnesium powder are discretely present in the state of being extended slenderly in the longitudinal direction by the working in the core region 2 of the tape wire before the firing. A compact body 3 of boron is present to be buried into gaps between the particles 4.

In the core region 32 after the firing, voids 6 extended slenderly in the longitudinal direction are discretely present, and other portions are made of a polycrystal 5 formed of crystal grains continuously connected to each other into a network form, as illustrated in FIG. 3B.

The respective sizes and shapes of the voids 6 are substantially consistent with those of the particles 4 of the Mg powder before the firing. It can be therefore considered that in the firing the Mg component of the magnesium powder particles 4 diffuses into the region of the compact body 3 of boron so that magnesium and boron react with each other, whereby the polycrystal 5 of $MgB_2$ is generated so that portions where the magnesium powder particles 4 are originally present have turned to the voids 6.

Hereinafter, the present invention will be more specifically described by way of working examples of the present invention, and comparative examples.

Comparative Example 1

Prepared were an Mg powder having a particle size of 45 μm as raw material of Mg (magnesium) and an amorphous boron powder having a volume-mean particle size of 0.05 μm as raw material of B (boron). These raw materials were used to produce a tape wire, and the wire was fired at 600° C. for 1 hour. Thereafter, the critical current density Jc thereof was measured. As a result, at 7 T, the critical current density Jc was a value of 150 A/mm$^2$.

Crystal grains constituting the polycrystal 5 of $MgB_2$ were very fine particles each having a smaller particle size than 0.1 μm.

From the tape wire after the firing, the sheath region of the outer circumferential portion was carefully peeled off. The dimension and the weight of the core region 32 made bare were measured, and a calculation was made about the relative density (="actual density"/"theoretical density"×100) of the core region 32. As a result, it was understood that the density was from about 50 to 55%. The reason why the relative density was low as described herein is that the voids 6 were present.

The individual reference numbers described in Comparative Example 1 are the same numbers as used in FIG. 3B (the same matter is applied to Comparative Example 2).

Comparative Example 2

Prepared were an Mg powder having a particle size of 45 μm as raw material of Mg and a crystal boron powder (β boron) having a volume-mean particle size of 45 μm as raw material of B. These raw materials were used to produce a tape wire, and the wire was fired at 650° C. for 1 hour. Thereafter, the critical current density Jc thereof was measured. As a result, at 7 T, the critical current density Jc was about zero.

From the tape wire after the firing, the sheath region of the outer circumferential portion was carefully peeled off. The core region 32 made bare was subjected to X-ray diffraction analysis. As a result, Mg was observed as the main phase thereof. Thus, it was understood that the reaction was unfinished.

Thus, investigations were made about cases of extending the period for firing the tape wire. However, even when the period was made as long as 60 hours, the reaction hardly advanced. Thus, next, investigations were made about cases of raising the firing temperature. As a result thereof, it was understood that the reaction was substantially completed when conditions for the firing were set to conditions of a firing temperature of 900° C. and a firing period of 12 hours, so that $MgB_2$ turned to the main phase.

After the firing, crystal grains of the polycrystal 5 of $MgB_2$ of the tape wire were observed through the SEM. The grains were coarse grains having a grain size of several micrometers to ten and several micrometers. This is because the crystal grains grew, following the rise in the temperature for the firing.

The critical current density Jc of the tape wire obtained by the firing at 900° C. for 12 hours was measured. As a result, the value thereof was 5 A/mm$^2$ at 7 T. When this value is compared with that obtained in the case of the firing at 600° C. for 1 hour, the value was made better but was remarkably lower than that obtained in the case of using the amorphous powder.

Example 1

Prepared were an Mg powder having a particle size of 45 μm as raw material of Mg and a crystal boron powder (β boron) having a volume-mean particle size of 45 μm as raw material of B. The B raw material was pulverized by use of a dry ball mill. The crystal powder as the B raw material is high in hardness. Thus, a raw material used for a pulverizing vessel and balls of the ball mill was $ZrO_2$ which has a high hardness. The size (diameter) of the balls was set to 10 mm.

The particle sizes were each calculated out from a particle size distribution obtained by a measurement through a particle size distribution meter (MICROTRUCK MT3300, manufactured by Nikkiso Co., Ltd.). The principle of the measurement is based on a laser diffraction/scattering method.

Figure 4:
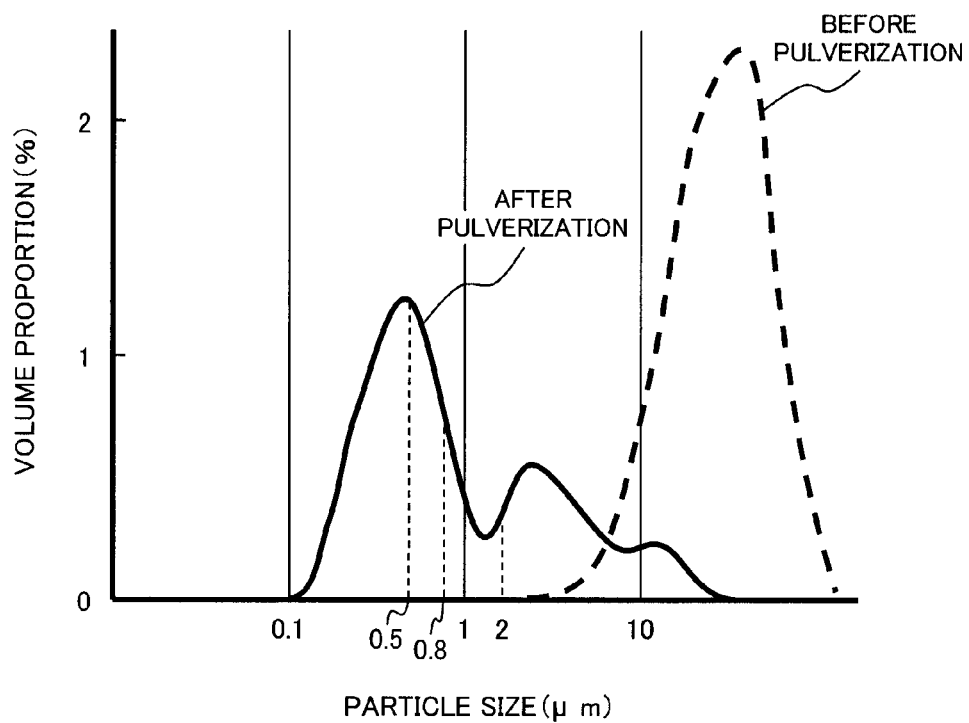
FIG. 4 is a graph showing respective particle size distributions of a boron powder which is a raw material of Example 1 before and after the powder is pulverized.

FIG. 4 is a graph showing respective measurement results of the particle size distribution of the boron crystal powder before and after the pulverization.

From this graph, it is understood that the greatest value of the particle size was 0.5 μm in the particle size distribution of the boron crystal powder after the pulverization. The volume-mean particle size thereof was about 2 μm.

For reference, it is desired that the boron crystal powder having the above-mentioned particle size distribution after the pulverization is classified to collect a powder having a volume-mean particle size of 1 μm or less. The classification of the powder may be attained by wind power.

A tape wire was formed from the Mg (magnesium) powder and the pulverized B (boron) powder, and fired at 600° C. for 1 hour. Thereafter, the core region containing $MgB_2$ was subjected to X-ray diffraction analysis. As a result, it was understood that the reaction was unfinished. For this reason, the firing period was made long to fire the same tape wire as described herein. As a result thereof, when the firing period was adjusted to 60 hours, $MgB_2$ turned to the main phase. However, the peak of Mg was also observed in a part of the original quantity thereof. It is therefore understood that the reaction was partially unfinished.

The critical current density Jc of the tape wire obtained by the firing at 600° C. for 60 hours was measured. As a result, at 7 T, the value was 80 A/mm$^2$, which is far larger value as compared with that of the tape in Comparative Example 2.

The value is about ½ of that in Comparative Example 1. However, the amorphous powder used as the B raw material in Comparative Example 1 is expensive and further difficult to obtain. By contrast, the crystal powder (β boron) used in the present example is inexpensive and is easy to obtain.

Furthermore, in order to complete the reaction, the firing temperature was raised. As a result, when the firing conditions were adjusted to a firing temperature of 800° C. and a firing period of 12 hours, the peak of Mg in the X-ray diffraction analysis was extinguished.

The critical current density Jc of the tape wire obtained by the firing at 800° C. for 12 hours was measured. As a result, the value was 60 A/mm at 7 T.

Figure 5:
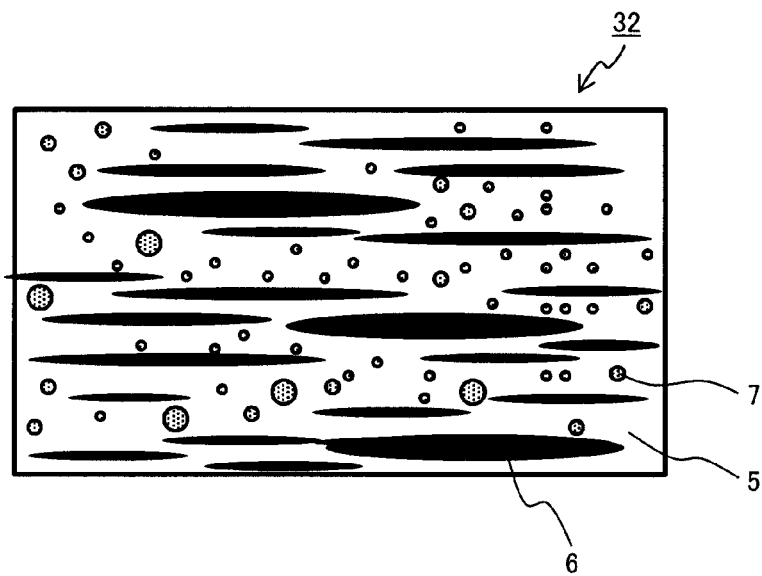
FIG. 5 is an enlarged sectional view which schematically illustrates an $MgB_2$ core region of a tape wire of Example 1 after the wire is fired.

FIG. 5 is a schematic image obtained by observing, through the SEM, a core region 32 as the core region of the tape wire after the firing in the present example.

As illustrated in this figure, substantially the same microstructure as generated in the core region of Comparative Example 1 was observed. However, the present example was different from Comparative Example 1 in the following three points:

1) The quantity of voids 6 was small.
2) Remaining unreacted boron 7 was observed.
3) Crystal grains constituting a polycrystal 5 of $MgB_2$ had a somewhat large particle size of 0.5 μm.

In order to quantify the voids 6, the relative density of the core region 32 was calculated out. As a result, it was understood that the density was about from 65 to 70%. This is a higher value than the value in Comparative Example 1, and is consistent with the SEM observation result.

Figure 6:
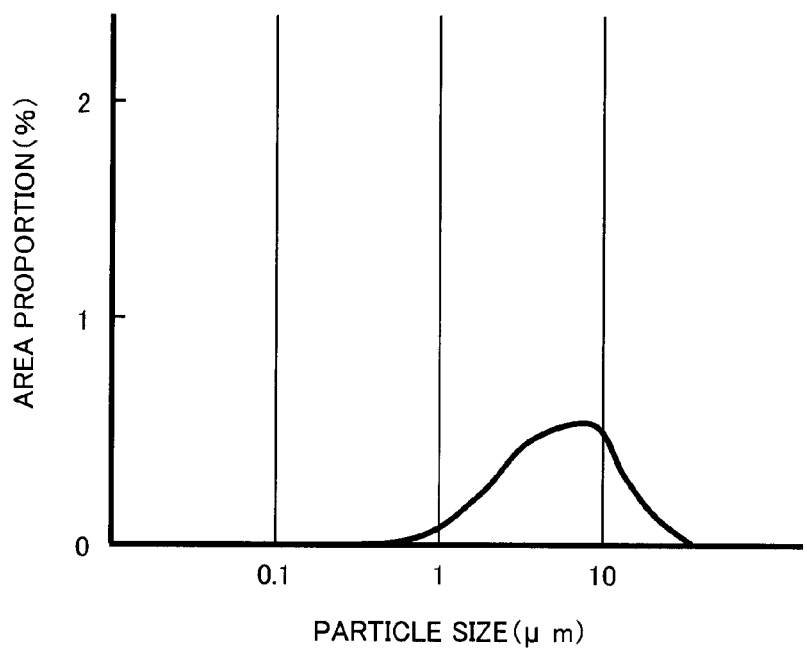
FIG. 6 is a graph showing a particle size distribution of boron remaining in the $MgB_2$ core region of the tape wire of Example 1 after the firing.

FIG. 6 is a graph showing results obtained by measuring, from the SEM image, the particle size distribution of the remaining unreacted boron 7.

From this graph, it is understood that the particle size of the unreacted boron 7 was distributed in the range of about 1 to 20 μm and the greatest value of the particle size was about 9 μm. It can be considered that this is because coarse B particles remain in the B raw material and the reaction of these particles was finished on the way. The sectional area of the remaining unreacted boron 7 was 13% of the corresponding sectional area of the core region 32 portion other than the voids in the core region 32, and occupied a relatively large proportion.

Example 2

Prepared were an Mg powder having a particle size of 45 μm as raw material of Mg and a crystal boron powder (β boron) having a volume-mean particle size of 45 μm as raw material of B. First, in the same manner as in Example 1, the raw material of B was pulverized by use of a dry ball mill. Subsequently, the pulverized material was secondarily pulverized by use of a wet bead mill. The material of the used balls (beads) was $ZrO_2$, and the size (diameter) of the balls was set to 0.2 mm. The wet pulverization has an effect of preventing the aggregation of the powder particles. The use of the small-diameter balls increases contact points between the powder and the balls so that the powder may be pulverized into a smaller size.

Figure 7:
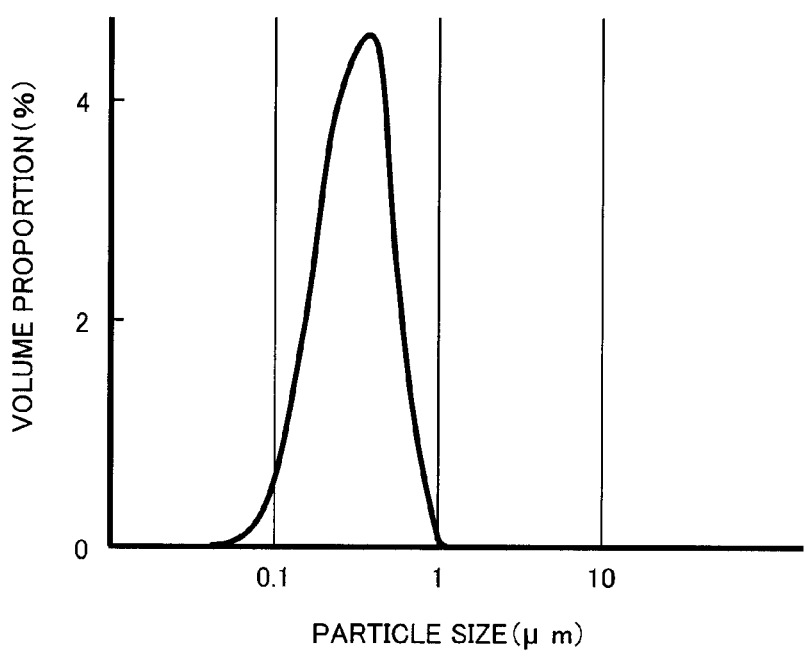
FIG. 7 is a graph showing a particle size distribution of a boron powder that is a raw material of Example 2 after the powder is pulverized.

FIG. 7 is a graph showing the particle size distribution of the resultant boron powder.

From this graph, it is understood that the volume-mean particle size was 0.3 μm. The particle size distribution was also sharp, and powder particles having a particle size more than 1 μm were almost none.

When the firing temperature was fixed to 600° C. and the firing period was varied, the critical current density Jc of the tape wire became largest when the firing period was 12 hours. The obtained value was 180 A/mm$^2$ at 7 T, which was a higher value than that in Comparative Example 1.

Figure 8:
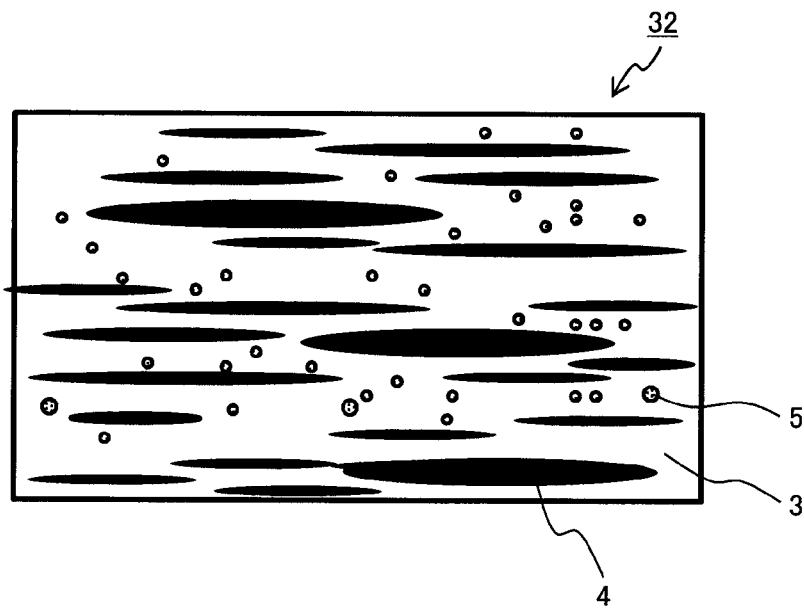
FIG. 8 is an enlarged sectional view which schematically illustrates an $MgB_2$ core region of a tape wire of Example 2 after the wire is fired.

The $MgB_2$ core of the tape wire after the firing was observed through the SEM. As a result, a microstructure as illustrated in FIG. 8 was observed. This microstructure had the following characteristics:

1) The quantity of voids 6 was small (relative density: 65 to 70%).
2) The remaining proportion of unreacted boron 7 was 5% or less.
3) Crystal grains constituting a polycrystal 5 of $MgB_2$ had a size of 0.1 μm or less.

(Consideration of Advantageous Effects)

The inventors have investigated various means for pulverizing crystalline boron powder to find out that the selection of appropriate conditions for dry ball milling treatment makes it possible to adjust the volume-mean particle size of the powder to 2 μm or less. Moreover, the inventors have also found out that the selection of appropriate conditions for wet bead milling treatment using small-diameter balls makes it possible to adjust the volume-mean particle size of the powder to 0.3 μm or less. As a result, it has been understood that even when a crystalline powder (β boron), which is inexpensive and easy to obtain, is used as B raw material, the resultant superconducting wire can gain a very high critical current density Jc.

Hereinafter, reasons therefor will be considered.

Factor for deciding the critical current density Jc of $MgB_2$ are flux pinning and the effective area of the current path (concerned).

Firstly, a description is made about the flux pinning.

In a superconductor in a magnetic field, magnetic flux is present in the state of being quantized. When a current is passed into the superconductor, Lorentz force is applied to the quantized magnetic flux. By the Lorentz force, the quantized magnetic flux is moved, whereby pinning loss is generated so that the resistance of the superconductor does not turn to zero. It is therefore important to produce spots where the potential becomes smallest which are called "flux pinning centers" thereby to cause force for keeping the quantized magnetic flux (flux pinning force) to act so as to cause the quantized magnetic flux not to be moved. Main flux pinning centers of a $MgB_2$ polycrystal are grain boundaries thereof. It is therefore important to make grains of the crystal small in order to gain a high critical current density Jc.

Secondly, a description is made about the effective area of the current path.

As described above, the core region 2 after the firing has portions other than the polycrystal 5 of $MgB_2$, such as the voids 6 and the unreacted boron 7. Moreover, oxygen, water and others are adsorbed on the core surface since the raw material of Mg and the raw material of B are each powder. At the time of the firing, these components form oxides, so that the oxides may remain in the grain boundaries. It is also important to decrease these regions which do not contribute to current transport in order to gain a high critical current density Jc.

In light of the above, reasons why a high critical current density Jc was obtained in each of Examples described above are recited below.

1) Improvement in the relative density by use of the crystal powder (decrease in the voids):

The voids 6 are present in the core region 2 after the firing. The generation of the voids is caused by a matter that the volume is shrunken by 34% at the time of the reaction of $Mg+2B \rightarrow MgB_2$, since Mg and amorphous boron which are raw materials have densities of 1.74 g/cm$^3$ and 1.7 g/cm$^3$, respectively, while $MgB_2$ has a density of 2.62 g/cm$^3$. Crystal boron (β boron) has a density of 2.37 g/cm$^3$; thus, the volume is shrunken by 21% at the time of the reaction. Thus, in this case, the volume shrinkage is smaller by 13% than in the case of using amorphous boron. This volume-shrinkage-difference results in the decrease in the voids 6, that is, the improvement in the relative density. The relative-density-improvement makes the effective area of the current path better so that the critical current density Jc is made higher.

2) Realization of low-temperature firing by making the crystal powder finer:

When $MgB_2$ is fired at high temperature over a long period, crystal grains thereof turn coarse. Thus, the grain boundaries which become flux pinning centers are decreased so that flux pinning force is declined. When $MgB_2$ is fired at low temperature for a short period, the reaction is not finished so that regions that are not made of $MgB_2$ are present in a large proportion. Thus, a sufficient effective area of the current path cannot be gained.

By contrast, when the crystal powder is made very fine, the reaction of $Mg+2B \rightarrow MgB_2$ comes to be promptly caused; thus, even by low-temperature/short-period firing, which does not make the crystal grains coarse, a sufficient effective area of the current path comes to be obtained. As a result, a high critical current density Jc is obtained.

3) Decrease in the oxygen content by percentage by use of crystal boron:

The surface of the crystal B powder reflects its crystal plane to be very smooth. The surface area thereof is smaller than that of amorphous B powder having the same particle size. Thus, the quantity of water and others adsorbed onto the crystal B powder is small. When amorphous B powder having a particle size of 0.05 μm is heated to 200° C., the weight thereof is decreased by 2%. However, the rate of a decrease in the weight is 1% or less by weight even about very fine crystal B powder. Accordingly, in a powder-filled region of the tape wire before the firing, water remains in a proportion of about 1% or less by weight in the amorphous B powder, and remains in a proportion of about 0.5% or less by weight in the crystal B powder. In the firing, these components turn to oxides to decrease the effective area of the current path. In conclusion, the low content by percentage of water and others in the crystal boron would contribute to the improvement in the critical current density Jc.

Example 3

In Examples 1 and 2, Mg and B were mixed with each other at a ratio by mole of 1:2. However, the same advantageous effects are obtained even when these are mixed with each other at a ratio by mole of 1:1.5 to 1:2.5. When appropriate conditions are selected at the time of firing a mixture of Mg powder and B powder, the phase of any compound other than $MgB_2$ is not easily generated so that either of Mg and B remains as an unreacted portion. When the ratio by mole in this case is within the above-mentioned range, a relatively high critical current density Jc can be obtained. It is however desired that the quantity of the unreacted Mg and B present is as small as possible.

Example 4

The respective B powders obtained in Examples 1 and 2 were used. $B_4C$ powders (boron carbide powders) therefrom were each added to Mg in a proportion of 1 to 20% by mole of Mg to produce tape wires. The $B_4C$ powders were adjusted into two-species particle sizes, i.e., 0.5 μm and 0.05 μm. The firing conditions were set to a firing temperature of 600° C. and a firing period of 12 hours.

Figure 9:
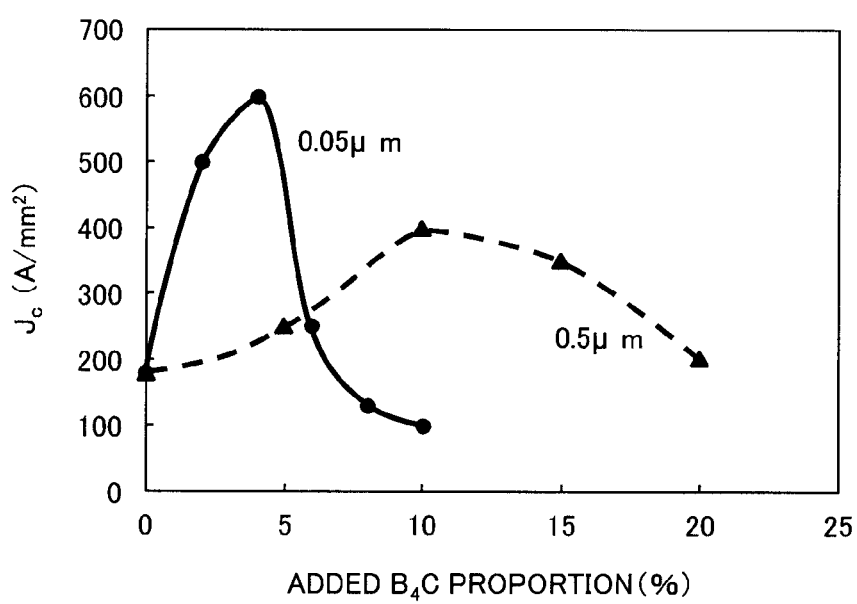
FIG. 9 is a graph showing respective particle size distributions of boron powders which are each a raw material of Example 4 after the powders are pulverized.

FIG. 9 is a graph showing a relationship between the addition amount of each of the two-species $B_4C$ and the critical current density Jc at 4.2 K and 7 T.

In accordance with the particle size of $B_4C$ powder, the optimal addition amount thereof is varied. When the $B_4C$ powder having the fine particle size of 0.05 μm was added in a proportion of 4%, the greatest critical current density Jc was obtained and was 600 A/mm$^2$.

The reason therefor would be as follows: as well known, B (boron) sites of $MgB_2$ are partially substituted with C (carbon) to generate a lattice distortion; and a reduction in the coherence length that follows this distortion makes an improvement in the upper critical field, and strengthens pinning force in the grain boundaries. In other words, it has been verified that also in the very fine crystal B powders obtained in Examples 1 and 2, the same Jc-improving effect by the C (carbon) substitution as seen in the amorphous B powder is obtained.

In the present example, $B_4C$ powder was added as a C (carbon) supplying source; however, this source may be any other compound that contains C.

The high-Jc $MgB_2$ superconducting wire obtained in each of Examples 1 and 2 needs not to be limited particularly to any tape wire. Even when the wire is a wire having any shape and any wire diameter such as a round wire or a rectangular wire, the same advantageous effects can be obtained.

The present invention may not be applied to any wire having a single $MgB_2$ core; thus, the present invention may be applied to a multi-core wire including plural $MgB_2$ cores. Generally, in particular, its $MgB_2$ cores are each fine in a multi-core wire; however, in a case where highly-hard and coarse B powder particles as seen in Comparative Example 2 are present in this wire, the particles make inroads in the metal material surrounding the $MgB_2$ cores when the wire is worked. Thus, the cores are broken or disconnected. The very fine crystal B powders obtained in Examples 1 and 2 have an advantageous effect of preventing the breaking.

The very fine crystal B powder obtained by the present invention may be applied to not only any wire but also any bulk magnet or other articles.

The use of a high-Jc $MgB_2$ superconducting wire obtained by the present invention makes it possible to raise the intensity of the magnetic field of a superconductive magnet applied to a nuclear magnetic resonance spectrometer (NMR), a magnetic resonance imaging diagnostic machine (MRI), and others. As compared with Nb—Ti, $Nb_3Sn$ and other materials that are the main current at present, $MgB_2$ has a higher Tc. Thus, $MgB_2$ has a probability that without refrigeration with liquid helium, a machine can be operated by cooling by means of a refrigerating machine.

After the wire is fired, $MgB_2$ constituting the core region has grain boundaries. The size of the $MgB_2$ grains divided by the grain boundaries is equivalent to the particle size of the boron powder which is the raw material of B. Moreover, when boron remaining in the core region after the firing is crystalline, it can be presumed that the B raw material is also crystalline boron.

What is claimed is:

1. A precursor of an $MgB_2$ superconducting wire, having a linear structure including a core region containing a magnesium powder and a boron powder, and a sheath region formed of a metal covering an outer circumferential portion of the core region,
    wherein particles of the magnesium powder are discreetly present in a state of being extended slenderly in a longitudinal direction in the core region, and compact bodies of the boron powder are present to be buried into gaps between the particles of the magnesium powder,
    wherein the boron powder is crystalline, has a smooth crystal plane, and has a volume-mean particle size of 2 µm or less, and
    wherein an actual density of the core region is about from $1.703 \times 10^3$ to $1.834 \times 10^3$ kg/m$^3$.

2. The precursor according to claim 1, wherein water content of each of the magnesium powder and the boron powder is 0.5% or less by weight.

3. The precursor according to claim 1, wherein a ratio by mole of magnesium contained in the core region to boron contained therein is from 1:1.5 to 1:2.5.

4. The precursor according to claim 1, wherein the core region includes a boron carbide powder, the boron carbide powder has a volume-mean particle size is 0.5 µm or less, and a ratio by mole of boron carbide contained in the core region to magnesium contained therein is from 0.01:1 to 0.2:1.

5. A method for producing a precursor of an $MgB_2$ superconducting wire including a core region containing a magnesium powder and a boron powder, and a sheath region formed of a metal covering an outer circumferential portion of the core region, the method comprising the steps of:
    a pulverizing step of pulverizing a crystalline boron powder or a crystalline boron bulk to obtain a crystalline boron powder having a volume-mean particle size of 2 µm or less;
    a mixing step of mixing the crystalline boron powder with a magnesium powder to obtain a mixed powder after the pulverizing step; and
    a wire-forming step of filling the mixed powder into a metallic tube, and subjecting the metallic tube filled with the mixed powder to area-reducing working to form a wire, thereby forming particles of the magnesium powder which are discretely present in a state of being extended slenderly in a longitudinal direction in the core region, and compact bodies of the boron powder which are present to be buried into gaps between the particles of the magnesium powder.

6. The method according to claim 5, wherein the crystalline boron powder has the volume-mean particle size of 0.5 µm or less.

7. An $MgB_2$ superconducting wire produced by use of the precursor recited in claim 1.

8. A nuclear magnetic resonance spectrometer including the $MgB_2$ superconducting wire recited in claim 7.

9. A magnetic resonance imaging machine including the $MgB_2$ superconducting wire recited in claim 7.

10. A precursor of an $MgB_2$ superconducting wire, having a linear structure including a core region containing a magnesium powder and a boron powder, and a sheath region formed of a metal covering an outer circumferential portion of the core region,
    wherein particles of the magnesium powder are discretely present in a state of being extended slenderly in a longitudinal direction in the core region, and compact bodies of the boron powder are present to be buried into gaps between the particles of the magnesium powder,
    wherein the boron powder is crystalline, has a smooth crystal plane, and has a volume-mean particle size of 2 µm or less.

11. The precursor according to claim 10,
    wherein water content of each of the magnesium powder and the boron powder is 0.5% or less by weight.

* * * * *